(12) United States Patent
Oh et al.

(10) Patent No.: US 8,847,234 B2
(45) Date of Patent: Sep. 30, 2014

(54) THIN FILM TRANSISTOR, METHOD FABRICATING THEREOF, LIQUID CRYSTAL DISPLAY DEVICE AND METHOD FOR FABRICATING THE SAME

(75) Inventors: Tae-Young Oh, Paju-Si (KR); Heung-Lyul Cho, Goyang-Si (KR); Ji-Eun Jung, Seoul (KR)

(73) Assignee: LG Display Co., Ltd., Seoul (KR)

( * ) Notice: Subject to any disclaimer, the term of this patent is extended or adjusted under 35 U.S.C. 154(b) by 84 days.

(21) Appl. No.: 13/564,402

(22) Filed: Aug. 1, 2012

(65) Prior Publication Data

US 2013/0037814 A1  Feb. 14, 2013

(30) Foreign Application Priority Data

Aug. 9, 2011 (KR) .................. 10-2011-0079281

(51) Int. Cl.
| | |
|---|---|
| H01L 27/12 | (2006.01) |
| H01L 21/20 | (2006.01) |
| G02F 1/1368 | (2006.01) |
| G02F 1/1362 | (2006.01) |
| H01L 21/28 | (2006.01) |
| H01L 29/786 | (2006.01) |
| G02F 1/1333 | (2006.01) |

(52) U.S. Cl.
CPC ...... *H01L 21/28008* (2013.01); *H01L 27/1244* (2013.01); *G02F 1/1368* (2013.01); *G02F 1/136286* (2013.01); *H01L 27/1288* (2013.01); *G02F 2001/133357* (2013.01); *H01L 27/1248* (2013.01); *H01L 29/78636* (2013.01)
USPC .............. 257/72; 257/E21.414; 257/E27.111; 438/479

(58) Field of Classification Search
None
See application file for complete search history.

(56) References Cited

U.S. PATENT DOCUMENTS

| 4,253,888 A * | 3/1981 | Kikuchi ........................ 438/514 |
| 2009/0184325 A1* | 7/2009 | Park et al. ....................... 257/72 |

* cited by examiner

*Primary Examiner* — Michael Lebentritt
*Assistant Examiner* — Kevin Quinto
(74) *Attorney, Agent, or Firm* — Fenwick & West LLP

(57) ABSTRACT

A thin-film transistor array substrate and a fabrication method thereof according to an embodiment of the present invention are disclosed to form an interlayer insulating layer, thereby reducing a failure occurred during the process subsequent to a gate electrode. The thin-film transistor disclosed according to the present invention may include a substrate, a gate electrode formed on the substrate, a planarized insulating layer formed at a lateral surface portion of the gate electrode and at an upper portion of the substrate, a gate insulating layer formed on the planarized insulating layer containing an upper portion of the gate electrode, an active layer formed at an upper portion of the planarized insulating layer located at an upper side of the gate electrode, and a source electrode and a drain electrode formed on the active layer and separated from each other based on a channel region.

18 Claims, 11 Drawing Sheets

REAR EXPOSING

THIN FILM TRANSISTOR, METHOD FABRICATING THEREOF, LIQUID CRYSTAL DISPLAY DEVICE AND METHOD FOR FABRICATING THE SAME

CROSS-REFERENCE TO RELATED APPLICATIONS

This application claims the benefit of Korean Patent Application No. 10-2011-0079281, filed on Aug. 9, 2011, which is hereby incorporated by reference for all purposes as if fully set forth herein.

BACKGROUND OF THE INVENTION

1. Field of the Invention

The present invention relates to a thin-film transistor and a liquid crystal display device, and more particularly, to a thin-film transistor, a fabrication method thereof, a liquid crystal display device using the same, and a fabrication method thereof.

2. Description of the Related Art

In recent years, with rising interests in information displays and increasing demands to use portable information media, researches and commercialization of light-weight and thin-profile flat panel displays (FPDs) for substituting traditional displays such as cathode ray tubes (CRTs) have been actively carried out. In particular, among those flat panel displays, a liquid crystal display (LCD) as a device for expressing an image using optical anisotropy of liquid crystals has been actively used in notebooks, desktop monitors, and the like due to its excellent resolution, color expression, image quality, and the like.

An active matrix (AM) method, which is a driving method primarily used in the liquid crystal display, is a method of driving the liquid crystals of a pixel unit using an amorphous silicon thin-film transistor (a-Si TFT) as a switching element.

The liquid crystal display may largely include a liquid crystal panel for displaying an image, a backlight unit for emitting light to the liquid crystal panel, and a driving circuit unit for applying and controlling a signal voltage to the liquid crystal panel and backlight unit Hereinafter, the schematic structure of a typical liquid crystal display will be described below in detail with reference to FIG. 1. FIG. 1 is a cross-sectional view schematically illustrating a liquid crystal display in the related art. As illustrated in FIG. 1, the liquid crystal display may include a color filter substrate 87, a thin-film transistor array substrate 10, and a liquid crystal layer 97 interposed between the color filter substrate 87 and the thin-film transistor array substrate 10.

The color filter substrate 87 and thin-film transistor array substrate 10 are bonded by a sealant (not shown) formed at the outside of an image display region to face each other, and the bonding between the color filter substrate 87 and thin-film transistor array substrate 10 is implemented through an alignment key (not shown) formed on the color filter substrate 87 or thin-film transistor array substrate 10.

A thin-film transistor (not shown) is formed on the thin-film transistor array substrate 10, and the thin-film transistor may include a gate electrode 20 constituting part of the gate line (not shown), a source electrode 44 connected to the data line (not shown), and a drain electrode 45 connected to the pixel electrode 80.

Furthermore, the thin-film transistor may include an active layer 40 forming a conductive channel between the source electrode 44 and drain electrode 45 by a gate voltage supplied to the gate electrode 20.

An ohmic contact layer 41 is formed between the active layer 40 and the source electrode 44 and the drain electrode 45 to provide an electrical contact between the active layer 40 and the source and drain electrodes 44, 45 in an efficient manner.

Part of the source electrode 44 is extended in one direction to constitute part of the data line, and part of the drain electrode 45 is extended toward the pixel area and electrically connected to the pixel electrode 80 through a contact hole formed at the insulating layer 60.

Furthermore, as described above, a color filter 95 having a plurality of sub-color filters for implementing red, green and blue colors, a black matrix 90 for dividing between the sub-color filters and blocking light passing through the liquid crystal layer 97, and a common electrode 85 for applying a voltage to the liquid crystal layer 97 are formed on the color filter substrate 87.

On the other hand, a silicon oxide layer ($SiO_2$) or silicon nitride layer (SiNx) may be used for an insulating layer 30 between each constituent element constituting the thin-film transistor, and a chemical vapor deposition (hereinafter, referred to as "CVD") process may be used for the formation method. The chemical vapor deposition (CVD) process is a process of isotropic deposition in the direction from top to bottom. Accordingly, when a wiring is formed in a protruded manner with a predetermined thickness on the upper surface of the substrate, a thickness difference due to the wiring may not be compensated even if the insulating layer 30 is formed using the CVD process.

Meanwhile, a thickness of the gate electrode varies as the resolution of a liquid crystal display is developed from full high definition (FHD) to ultra dimension (UD). In other words, the transmission of a lot of information is required to implement such high resolution, and an area of the gate electrode applying a gate voltage to one pixel of the liquid crystal display should be enlarged to solve the problem. However, the enlarged area of the gate electrode causes a reduced aperture ratio of the liquid crystal display, and thus studies have been carried out in the direction of increasing a thickness of the gate electrode rather than enlarging an area of the gate electrode.

FIG. 2 is an enlarged cross-sectional view of a portion "A" of FIG. 1, illustrating the cross-sectional structure of a gate insulating layer formed by CVD on an upper portion of the gate electrode constituting a thin-film transistor. Referring to FIG. 2, it is seen that a thickness (t1) of the gate insulating layer 30 formed at an upper portion of the gate electrode 20 is identical to a thickness (t1) of the gate insulating layer 30 at an upper portion of the substrate 10.

However, a thickness (t2) of the gate insulating layer 30a covering a lateral surface 20a of the gate electrode 20 formed at a predetermined taper angle is less than a thickness (t1) of the gate insulating layer 30 at an upper portion of the gate electrode 20 and substrate 10. The thickness (t2) of the gate insulating layer 30a covering a lateral surface 20a of the gate electrode 20 formed at a predetermined taper angle is less than the thickness (t1) of the gate insulating layer 30 at an upper portion of the gate electrode 20 and substrate 10 because the thickness of a layer formed at an inclined surface having a predetermined angle is less than that of a layer formed at the plane surface due to its isotropic deposition.

On the other hand, as illustrated in FIG. 2, when an active layer 40 having a thickness of about 1000 Å is deposited on the gate insulating layer 30 as a subsequent process, a disconnected portion of the active layer 40 may occur on an inclined portion, namely, gate insulating layer 30a as illustrated in a portion "F" of FIG. 2 due to a step height of more than about 8000 Å. In other words, since a deposition thickness of the active layer 40 is very low, about 1000 Å, and thus it causes a phenomenon in which the active layer 40 is not formed on a surface of the gate insulating layer 30a corresponding to an inclined portion of the gate insulating layer 30 when forming it on the gate insulating layer 30a having a large step height.

In this case, a hole is formed on a lateral surface of the gate electrode 20 during the etching process carried out as a subsequent process, thereby exposing part of the gate electrode 20. The exposed gate electrode 20 may create a short phenomenon due to a relation between the source and drain electrodes formed at an upper portion of the gate electrode 20. In particular, as illustrated in the portion "F" of FIG. 2, when a protrusion or inverse taper angle is formed at an edge portion of the gate insulating layer 30 on an upper surface of the gate electrode 20, a disconnection portion of the active layer 40 may occur at a lateral surface of the gate electrode 20 during the subsequent process.

FIG. 3 is an enlarged cross-sectional view of a portion "A" of FIG. 1, illustrating the cross-sectional structure of a gate insulating layer formed by CVD at an upper portion of the gate electrode constituting a thin-film transistor. Referring to FIG. 3, a thickness (t3) of the gate insulating layer 30 is formed in a thick manner, for example, at a thickness of more than about 6000 Å, to prevent the deposition thickness (t2) at a lateral surface portion 30a of the gate insulating layer 30 from being formed at a low thickness as illustrated in FIG. 2. The lateral surface portion of the gate insulating layer 30, namely, a thickness (t4) of the gate insulating layer 30a, is formed higher than the thickness (t2) of the gate insulating layer 30a in FIG. 2 to enhance the coverage stability of the inclined portion, thereby suppressing the active layer 40 formed during the subsequent process at a lateral surface of the gate electrode 20 from being disconnected.

However, when a thickness of the gate insulating layer 30 is formed higher than that of the existing gate insulating layer in FIG. 2, for example, the thickness (t3) of the gate insulating layer 30 becomes too high to prevent an electric field from being sufficiently applied to the active layer 40, thereby deteriorating the electrical characteristics of elements such as on-current, VHR, or the like.

SUMMARY OF THE INVENTION

The present invention is to solve the problems in the related art, and an object of the present invention is to provide a thin-film transistor, a fabrication method thereof, a liquid crystal display using the same, and a fabrication method thereof capable of securing the characteristics of an insulating layer that is required during the formation of a thick layer to enhance the stability of an element.

In order to accomplish the foregoing objective, a thin-film transistor according to the present invention may include a substrate, a gate electrode formed on the substrate, a planarized insulating layer formed at a lateral surface portion of the gate electrode and at an upper portion of the substrate, a gate insulating layer formed on the planarized insulating layer containing an upper portion of the gate electrode, an active layer formed at an upper portion of the planarized insulating layer located at an upper side of the gate electrode, and a source electrode and a drain electrode formed on the active layer and separated from each other based on a channel region.

In order to accomplish the foregoing objective, a method of fabricating a thin-film transistor according to the present invention may include forming a gate electrode on a substrate; forming a planarized insulating layer at a lateral surface portion of the gate electrode and at an upper portion of the substrate; forming a gate insulating layer on the planarized insulating layer containing an upper portion of the gate electrode; forming an active layer at an upper portion of the planarized insulating layer located at an upper side of the gate electrode; and forming a source electrode and a drain electrode separated from each other based on a channel region on the active layer.

In order to accomplish the foregoing objective, a liquid crystal display having a thin-film transistor according to the present invention may include a gate line, a data line and a partial common voltage line formed to intersect with each other vertically and horizontally on a substrate to define a plurality of pixels; a planarized insulating layer formed at a portion of the substrate at which the gate line and data line intersect with each other, and formed on the substrate containing a gate electrode extended from the gate line, and a lateral surface of the gate line, gate electrode and partial common voltage line; a thin-film transistor made of a gate insulating layer formed on the planarized insulating layer containing an upper portion of the gate electrode, an active layer formed on the gate insulating layer at an upper portion of the gate electrode and partial common voltage line, and a source electrode and a drain electrode formed on the active layer and separated from each other based on a channel region; a passivation layer and an insulating layer formed over an entire surface of the substrate containing the source electrode and drain electrode to expose the drain electrode; and a pixel electrode electrically connected to the drain electrode and a common electrode electrically connected to the partial common voltage line, which are formed to be separated from each other and branched into a plural number on the insulating layer.

In order to accomplish the foregoing objective, a method of fabricating a liquid crystal display having a thin-film transistor according to the present invention may include forming a gate line, a gate electrode and a partial common voltage line on the substrate; forming a planarized insulating layer at an upper portion of the substrate containing a lateral surface of the gate line, gate electrode and partial common voltage line; forming a gate insulating layer on the planarized insulating layer containing an upper portion of the gate line, gate electrode and partial common voltage line; forming an active layer on the gate insulating layer at an upper side of the gate electrode; forming a source electrode and a drain electrode separated from each other based on a channel region on the active layer; forming a passivation layer and an insulating layer over an entire surface of the substrate containing the source electrode and drain electrode to expose the drain electrode; and forming a pixel electrode electrically connected to the drain electrode and a common electrode electrically connected to the partial common voltage line, which are formed to be separated from each other and branched into a plural number on the insulating layer.

As described above, a thin-film transistor, a fabrication method thereof, a liquid crystal display device using the same, and a fabrication method thereof according to the present invention may have the following effects.

According to a thin-film transistor, a fabrication method thereof, a liquid crystal display device using the same, and a fabrication method thereof in accordance with the present invention, it is possible to reduce failures occurred during the formation of a gate insulating layer that has been a problem in the related art. In particular, in the related art, a gate electrode is formed in a thick manner, thus causing a phenomenon that a lateral surface of the gate electrode is exposed during the etching process or data is open, but according to the present invention, a lateral surface of the gate electrode is covered in a thick manner and a step height due to a thickness of the gate electrode can be reduced by the formation of a planarized insulating layer, thus preventing a phenomenon that a lateral surface of the gate electrode is exposed during the etching process or data is open in the related art.

Furthermore, according to a thin-film transistor, a fabrication method thereof, a liquid crystal display device using the same, and a fabrication method thereof in accordance with the present invention, processes formed with a thick layer can be easily carried out due to the formation of an interlayer insulating layer. In other words, a gate insulating layer formed subsequent to the interlayer insulating layer may be formed with no large curvature, thereby facilitating the deposition of other subsequently formed elements. It has an effect of reducing product cost consumed during the implementation of an ultra dimension (UD) product.

In addition, according to a thin-film transistor, a fabrication method thereof, a liquid crystal display device using the same, and a fabrication method thereof in accordance with the present invention, metal patterns including a gate electrode can be implemented in the form of a narrow and thick shape rather than in the form of a thin and wide area to increase the transmittance in case of a liquid crystal display, thereby reducing the cost incurred during the fabrication of a backlight unit.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE INVENTION

Figure 1:
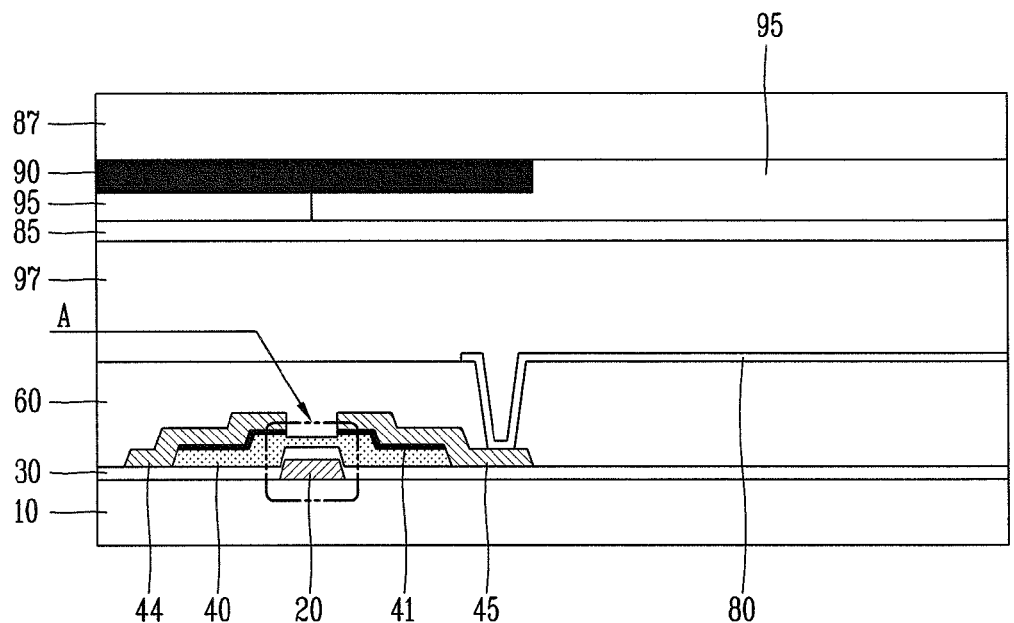
FIG. 1 is a cross-sectional view schematically illustrating a liquid crystal display in the related art.

Hereinafter, the structure of a thin-film transistor according to a preferred embodiment of the present invention will be described in detail with reference to the accompanying drawings. Even in different embodiments according to the present disclosure, the same or similar reference numerals are designated to the same or similar configurations, and the description thereof will be substituted by the earlier description.

Unless clearly used otherwise, expressions in the singular number used in the present disclosure may include a plural meaning.

Figure 4:
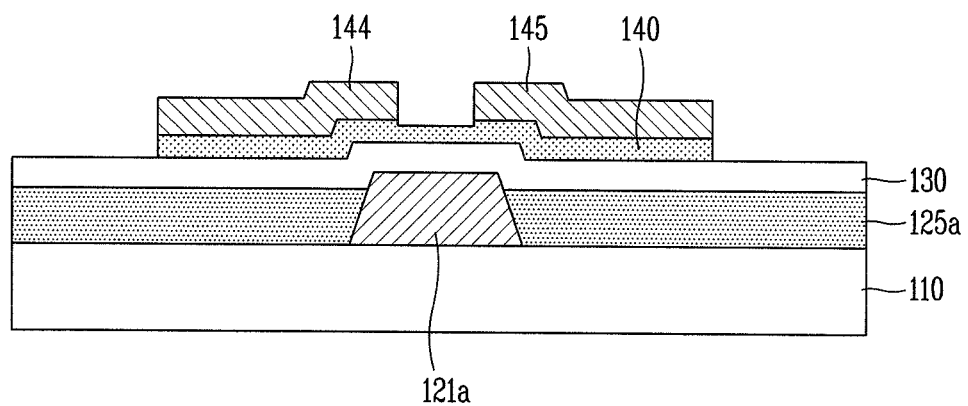
FIG. 4 is a view schematically illustrating the cross-sectional structure of a thin-film transistor according to the present invention.

FIG. 4 is a view schematically illustrating the cross-sectional structure of a thin-film transistor according to the present invention. A thin-film transistor according to the present invention may include a substrate 110, a gate electrode 121a formed on the substrate 110, a planarized insulating layer 125a formed at a lateral surface portion of the gate electrode 110 and at an upper portion of the substrate 110, a gate insulating layer 130 formed on the planarized insulating layer 125a containing an upper portion of the gate electrode 121a, an active layer 140 formed at an upper portion of the planarized insulating layer 125a located at an upper side of the gate electrode 121a, and a source electrode 144 and a drain electrode 145 formed on the active layer 140 and separated from each other based on a channel region.

The thickness of the gate electrode 121a is equal to or greater than 8000 Å and less than 9000 Å. The gate electrode 121a is not limited to the above thickness, and can be also adjusted to a suitable thickness as required.

Furthermore, the gate electrode 121a may be formed using a non-transparent low resistance conductive material, such as aluminium (Al), aluminium alloy (Al-alloy), tungsten (W), copper (Cu), chromium (Cr), molybdenum (Mo), molybdenum alloy (Mo-alloy), and the like, or may be formed with a multi-layer structure in which two or more low resistance conductive materials are laminated.

Furthermore, the planarized insulating layer 125a is made of any one of an organic material, inorganic material, an organic-inorganic compound, and an organic-inorganic mixture, and has high-temperature and high-planarization characteristics.

The high-planarization characteristic refers to a characteristic in which the planarized insulating layer 125a has a fluid characteristic and thus a layer having the same thickness is not formed at an upper surface of the substrate 110 and gate electrode 121a contrary to what is formed by a CVD (Chemical Vapor Deposition) process, but the planarized insulating layer 125a having the same thickness is deposited over an entire surface of the substrate 110 based on a surface of the substrate 110 regardless of the existence of the gate electrode 121a and thus the surface of the planarized insulating layer 125a is in a flat state with little curvature.

However, a protrusion portion having a predetermined thickness may be formed on a surface of the planarized insulating layer 125a due to the thickness of the gate electrode 121a, but the thickness of the protrusion portion is less than that of the gate electrode 121a, and does not have a large step height from a surface of the planarized insulating layer 125a and thus the surface of the planarized insulating layer 125a has a shape with a small curvature as a whole.

Furthermore, the planarized insulating layer 125a has a high-temperature characteristic. That is, the planarized insulating layer 125a is not affected by the CVD process used to form other elements subsequent to the formation of the planarized insulating layer. In other words, the planarized insulating layer 125a is not dissolved or the property thereof remains unchanged by the CVD process.

The temperature of the planarized insulating layer 125a having a high-temperature characteristic may be within a range of 200 to 500° C.

Furthermore, the planarized insulating layer 125a may have a characteristic of positive or negative photoresist. The planarized insulating layer 125a may be exposed through a mask when performing an exposure process on the planarized insulating layer if the planarized insulating layer 125a has a positive characteristic, and a back exposure may be carried out with no mask at a rear surface of the substrate 110 if the planarized insulating layer 125a has a negative characteristic. In other words, a non-transparent gate electrode 121a performs the role of a mask during the back exposure process.

Furthermore, the planarized insulating layer 125a exposes an upper surface of the gate electrode 121a not to affect the operation of other elements in a thin-film transistor.

Accordingly, a voltage applied to the gate electrode 121a performs the role of having a constant effect on a channel formed on the active layer 140 at an upper portion thereof through the gate insulating layer 130.

Figure 2:
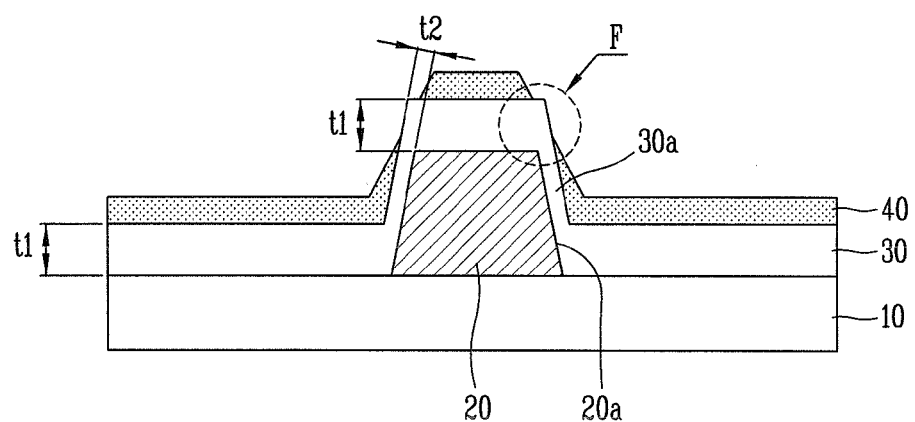
FIG. 2 is an enlarged cross-sectional view of a portion "A" of FIG. 1, illustrating the cross-sectional structure of a gate insulating layer formed by CVD at an upper portion of the gate electrode constituting a thin-film transistor.
Figure 3:
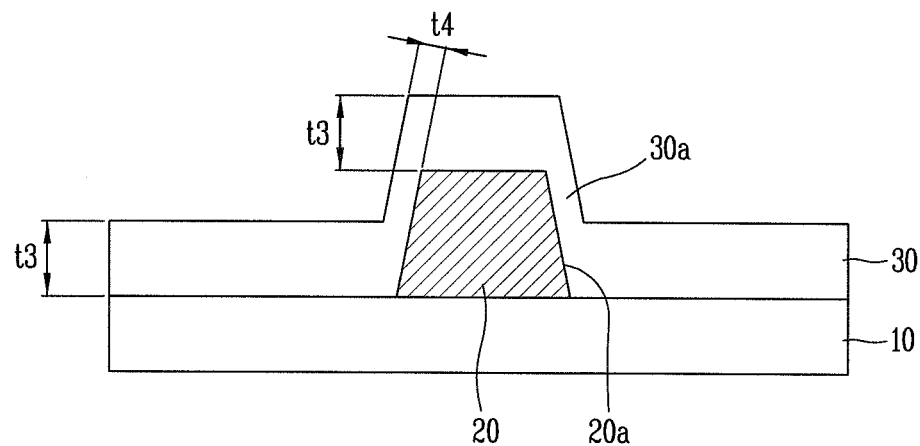
FIG. 3 is an enlarged cross-sectional view of a portion "A" of FIG. 1, illustrating the cross-sectional structure of a gate insulating layer formed by CVD at an upper portion of the gate electrode constituting a thin-film transistor.

However, the planarized insulating layer 125a does not cover an upper surface of the gate electrode 121a, and therefore, does not affect the operation of elements illustrated in FIGS. 1 through 3.

On the other hand, the gate insulating layer 130 may be formed of a silicon oxide ($SiO_2$) layer or silicon nitride ($SiN_x$) layer. The upper surface of the gate electrode 121a is covered by the gate insulating layer 130.

Furthermore, the active layer 140 may be formed by, but not limited to, using amorphous silicon. Polycrystalline silicon or oxide semiconductor may be also used as the active layer 140.

In addition, the source electrode 144 and drain electrode 145 may be formed using the same material as the material for forming the gate electrode 121a. Such material may include a non-transparent low resistance conductive material such as aluminium (Al), aluminium alloy (Al-alloy), tungsten (W), copper (Cu), chromium (Cr), molybdenum (Mo), molybdenum alloy (Mo-alloy), and the like. Alternatively, the source electrode 144 and drain electrode 145 may be formed with a multi-layer structure in which two or more low resistance conductive materials are laminated.

Figure 5A:
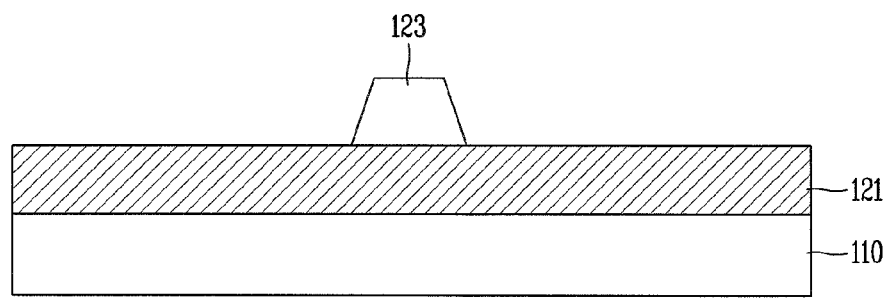
FIGS. 5A through 5K are process cross-sectional views illustrating a method of fabricating a thin-film transistor according to the present invention.

Meanwhile, a method of fabricating a thin-film transistor according to the present invention will be described below with reference to FIGS. 5A through 5K. FIGS. 5A through 5K are process cross-sectional views illustrating a method of fabricating a thin-film transistor according to the present invention. As illustrated in FIG. 5A, a first metal material is deposited on the substrate 110 to form a first metal material layer 121, and a photosensitive material is coated on the first metal material layer 121 to form a first photosensitive layer (not shown).

The thickness of the first metal material layer 121 may be equal to or greater than 8000 Å and less than 9000 Å. The first metal material layer 121 is not limited to the above thickness, and can be also adjusted to a suitable thickness as required.

Furthermore, the first metal material layer 121 may be formed using a non-transparent low resistance conductive material, such as aluminium (Al), aluminium alloy (Al-alloy), tungsten (W), copper (Cu), chromium (Cr), molybdenum (Mo), molybdenum alloy (Mo-alloy), and the like. Alternatively, the first metal material layer 121 may be formed with a multi-layer structure in which two or more low resistance conductive materials are laminated.

Although not shown in the drawing, the first photosensitive layer (not shown) is then selectively patterned through a first mask process using a photolithography process technology to form a first photosensitive pattern 123.

Figure 5B:
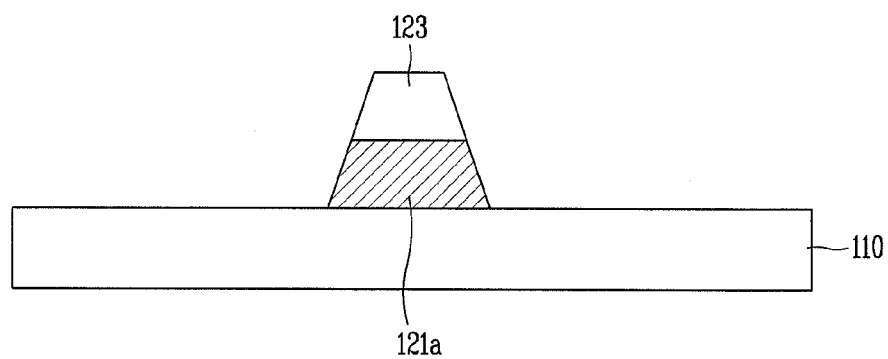

Subsequently, as illustrated in FIG. 5B, the first metal material layer 121 is selectively etched using the first photosensitive pattern 123 as an etching mask to form the gate electrode 121a.

Figure 5C:
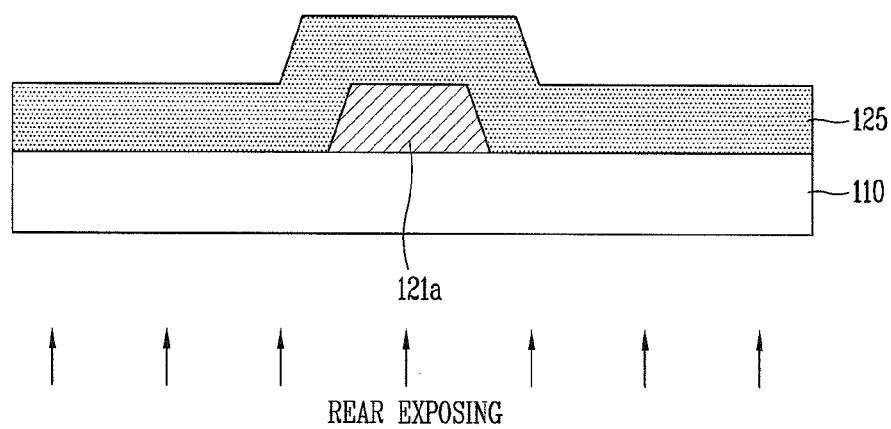

Next, as illustrated in FIG. 5C, the first photosensitive pattern 123 is removed to form a planarized insulating layer 125 using a method such as spin coating or slit coating on the substrate 110 containing the gate electrode 121a. The planarized insulating layer 125 is made of any one of an organic material, inorganic material, an organic-inorganic compound, and an organic-inorganic mixture, and has high-temperature and high-planarization characteristics.

The high-planarization characteristic refers to a characteristic in which the planarized insulating layer 125 has a fluid characteristic and thus a layer having the same thickness is not formed at an upper surface of the substrate 110 and gate electrode 121a contrary to what is formed by a CVD process, but the planarized insulating layer 125 having the same thickness is deposited over an entire surface of the substrate 110 based on a surface of the substrate 110 regardless of the existence of the gate electrode 121a and thus the surface of the planarized insulating layer 125 is in a flat state with little curvature.

However, a protrusion portion having a predetermined thickness may be formed on a surface of the common electrode 125 due to an effect of the thickness of the gate electrode 121a, but the thickness of the protrusion portion is less than that of the gate electrode 121a, and does not have a large step height from a surface of the planarized insulating layer 125 and thus the surface of the planarized insulating layer 125 has a shape with little curvature as a whole.

Furthermore, the planarized insulating layer 125 has a high-temperature characteristic. It means that the planarized insulating layer 125 is not affected by the CVD process used to form other elements subsequent to the formation of the planarized insulating layer. In other words, the planarized insulating layer 125 is not dissolved or the property thereof is unchanged by the CVD process.

The temperature of the planarized insulating layer 125 having a high-temperature characteristic may be within a range of 200 to 500° C.

Furthermore, the planarized insulating layer 125 may have a characteristic of positive or negative photoresist. The planarized insulating layer 125 may be exposed through a mask when performing an exposure process on the planarized insulating layer when the planarized insulating layer 125 has a positive characteristic, and a back exposure may be carried out with no mask at a rear surface of the substrate 110 when the planarized insulating layer 125 has a negative characteristic. In other words, a non-transparent gate electrode 121a performs the role of a mask during the back exposure process.

In particular, according to the present invention, a case where a negative photoresist is applied to the planarized insulating layer 125 is taken as an example.

Furthermore, the planarized insulating layer 125 exposes an upper surface of the gate electrode 121a not to have an effect on the operation of other elements in a thin-film transistor.

Accordingly, a voltage applied to the gate electrode 121a performs the role of having a constant effect on a channel formed on the active layer 140 at an upper portion thereof through the gate insulating layer 130.

However, the planarized insulating layer 125 does not cover an upper surface of the gate electrode 121a, and therefore, does not have an influence on the operation of elements in the related art.

Subsequently, as illustrated in FIG. 5C, a back exposure on the planarized insulating layer 125 is carried out for exposure. The gate electrode 121a has a non-transparent characteristic, and thus, performs the role of a photoresist mask. Furthermore, the back exposure irradiates light from the rear surface without using a mask, thereby having an advantage in the aspect of reducing the process cost.

Accordingly, a portion of the planarized insulating layer 125 formed at the remaining portion excluding an upper portion of the gate electrode 121a is exposed.

Figure 5D:
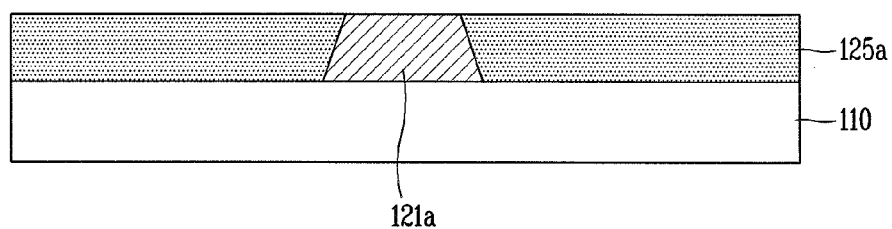

Next, as illustrated in FIG. 5D, the planarized insulating layer 125 is patterned through the developing process subsequent to the exposure process to form the planarized insulating layer pattern 125a. The planarized insulating layer 125 has a negative characteristic, and therefore, an exposed portion thereof is remained, and an unexposed portion thereof, namely, a portion of the planarized insulating layer at an upper portion of the gate electrode 121a is cured and removed during the developing process.

Accordingly, the planarized insulating layer pattern 125a remains only on the substrate 110 excluding the gate electrode 121a.

Hereinafter, the process of developing the planarized insulating layer 125 will be described below briefly. During the developing process, a portion that has been cured on the planarized insulating layer 125 is not dissolved by developing solution. The developing solution used for the developing process is a typical organic solvent such as xylene.

Accordingly, the planarized insulating layer 125 at an upper surface area of the gate electrode 121a is dissolved and removed in the developing solution during the developing process, and the upper surface of the gate electrode 121a may be exposed.

Next, a curing process may be carried out. The curing process refers to a process of moving the substrate 110 to a chamber of the heating device (not shown) such as a furnace, an oven, or the like, and then removing a solvent or the like to cure the planarized insulating layer 125.

An electric or magnetic field application device (not shown) may be provided in the heating device to apply an electric or magnetic field to the substrate 110.

Subsequent to the curing process, a volume of the planarized insulating layer 125 may be reduced within a predetermined range.

Figure 5E:
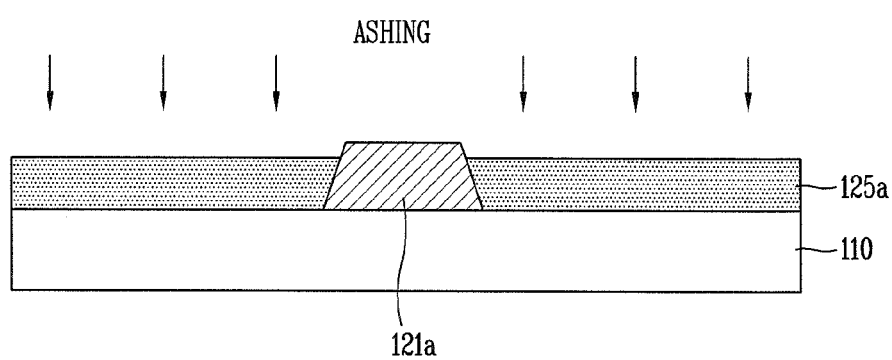

Subsequently, as illustrated in FIG. 5E, the ashing process is carried out to strip and adjust the planarized insulating layer pattern 125. During the ashing process, part of a surface of the planarized insulating layer pattern 125 is removed using a gas, for example, oxygen (O2) to reduce a thickness of the planarized insulating layer pattern 125 in a state that an upper surface of the gate electrode 121a is exposed.

Furthermore, the thickness of the planarized insulating layer pattern 125 may be formed equal to or less than that of the gate electrode 121a.

Then, when a thickness of the planarized insulating layer pattern 125 is less than that of the gate electrode 121a, a predetermined step height may be formed between the planarized insulating layer pattern 125 and the gate electrode 121a. The thickness of the step height formed between the planarized insulating layer pattern 125a and the gate electrode 121a may be 1-15% of the thickness of the gate electrode 121a. Accordingly, a partial region at both lateral surfaces of the gate electrode 121a is exposed together with an upper surface of the gate electrode 121a by forming the step height.

The thickness of the planarized insulating layer pattern 125a is formed higher than that of the gate electrode 121a, and when an upper surface of the gate electrode 121a is exposed, it may occur a phenomenon that the planarized insulating layer pattern 125a is loose by as much as a predetermined distance at a boundary between the gate electrode 121a and the planarized insulating layer pattern 125a. It is a portion causing a crack on the element.

On the other hand, according to another embodiment, the exposure process, developing process, and curing process may be omitted from the aforementioned processes to immediately perform the ashing process.

The ashing process is a process of removing the planarized insulating layer pattern 125a by as much as a predetermined distance, and the planarized insulating layer pattern 125a exposes an upper portion of the gate electrode 121a not to form a step height of patterning in a large scale, and therefore, the exposure process, developing process and curing process may be omitted.

Furthermore, according to still another embodiment, a method of dry or wet etching may be used instead of the ashing process.

Figure 5F:
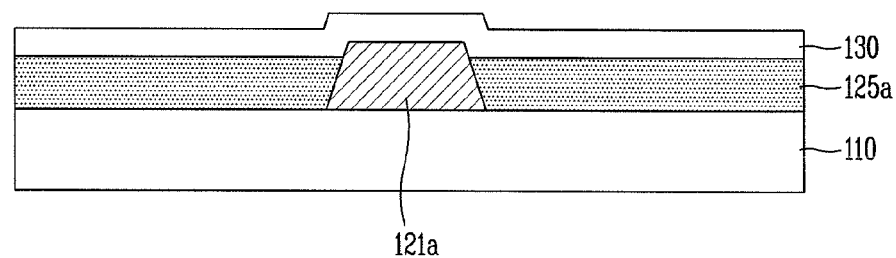

Next, as illustrated in FIG. 5F, the gate insulating layer 130 is formed over an entire surface of the gate electrode 121a and planarized insulating layer pattern 125a. The gate insulating layer 130 may be formed of a silicon oxide ($SiO_2$) layer or silicon nitride ($SiN_x$) layer. The upper surface of the gate electrode 121a is covered by the gate insulating layer 130.

Here, the planarized insulating layer pattern 125a exposes an upper surface of the gate electrode 121a not to have an effect on the operation of other elements in a thin-film transistor.

Furthermore, a voltage applied to the gate electrode 121a performs the role of having a constant effect on a channel formed on the active layer 140 at an upper portion thereof through the gate insulating layer 130. However, the planarized insulating layer pattern 125a does not cover an upper surface of the gate electrode 121a, and therefore, does not affect the operation of elements in FIGS. 1 through 3.

Figure 5G:
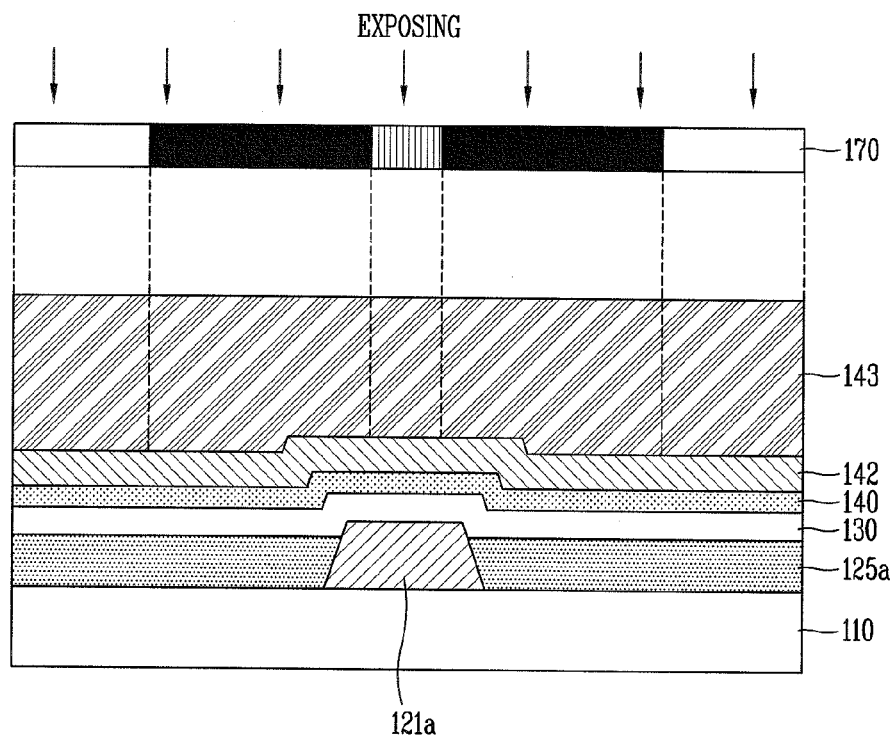

Subsequently, as illustrated in FIG. 5G, an active layer 140, an ohmic contact layer (not shown), and a second metal material layer 142 made of amorphous silicon are sequentially formed at an upper portion of the gate insulating layer 130, and then a photosensitive material is coated on the second metal material layer 142 to form a second photosensitive layer 143. The Ohmic contact layer (not shown) formed at an upper portion of the active layer 140 is made of n+ amorphous silicon layer, and patterned in the same form as a source electrode and a drain electrode formed in the subsequent process. The ohmic contact layer performs the role of establishing electrical contact between the source electrode, drain electrode and the active layer.

Furthermore, similar to the first metal material layer 121, the second metal material layer 142 may be formed of a non-transparent low resistance conductive material, such as aluminium, aluminium alloy, tungsten, copper, chromium, molybdenum, molybdenum alloy, and the like, or with a multi-layer structure in which two or more low resistance conductive materials are laminated.

Next, an exposure process is carried out through a second mask process with a photolithography technology using an exposure mask 170 which is a diffraction mask to expose the second photosensitive layer 143. Only part of light is transmitted by a semi-transmission portion 170b at a portion corresponding to the channel region on the second photosensitive layer 143, and light is blocked by a light blocking portion 170a at a portion corresponding to the source electrode and drain region, and light is transmitted by a light transmission portion 170c at the remaining portion.

Figure 5H:
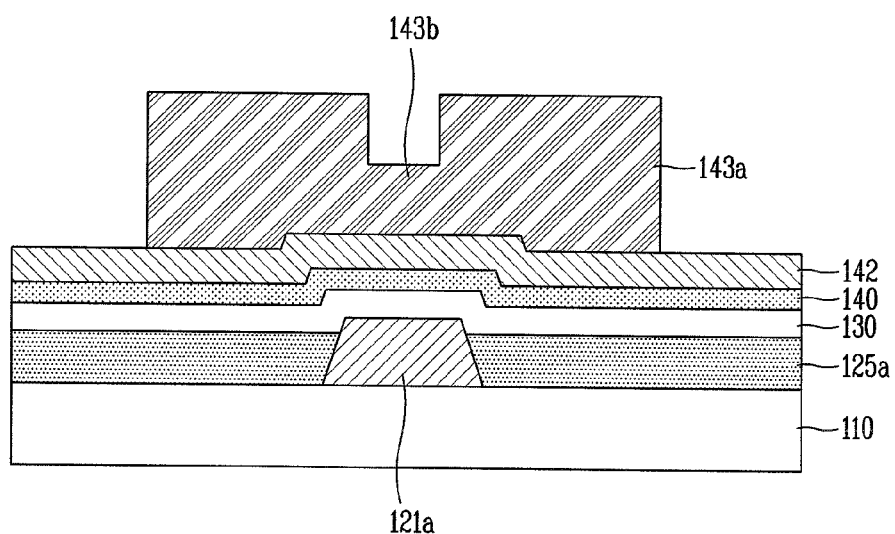

Subsequently, as illustrated in FIG. 5H, the second photosensitive layer 143 is exposed and then the developing process is carried out to selectively remove the second photosensitive layer 143, thereby forming the second photosensitive layer patterns 143a, 143b. The thickness of the second photosensitive layer pattern 143b corresponding to the channel region is formed lower than that of the second photosensitive layer 143a corresponding to the source electrode and drain formation region.

Figure 5I:
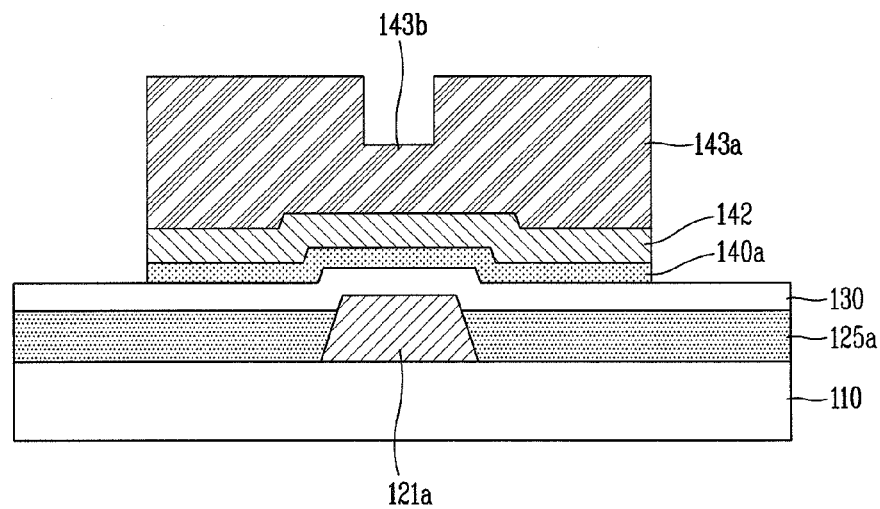

Next, as illustrated in FIG. 5I, the second metal material layer 142 and active layer 140 are sequentially etched using the second photosensitive layers 143a, 143b as an etching mask.

Figure 5J:
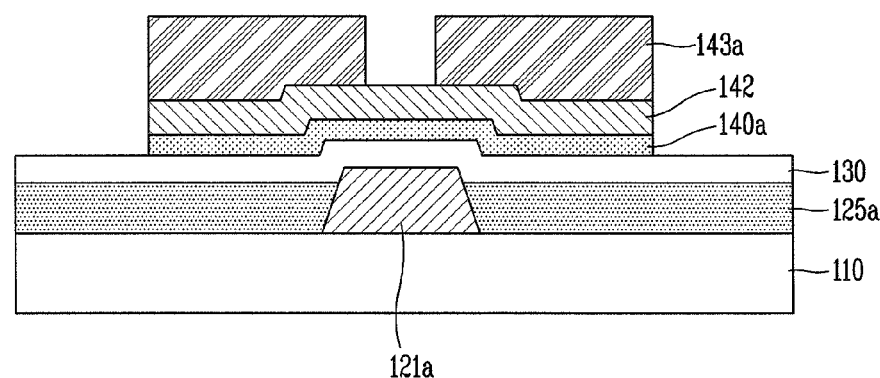

Subsequently, as illustrated in FIG. 5J, an ashing process is carried out to etch the second photosensitive layer 143b, thereby exposing an upper surface of the second metal material layer 142 at an upper portion of the channel region.

Figure 5K:
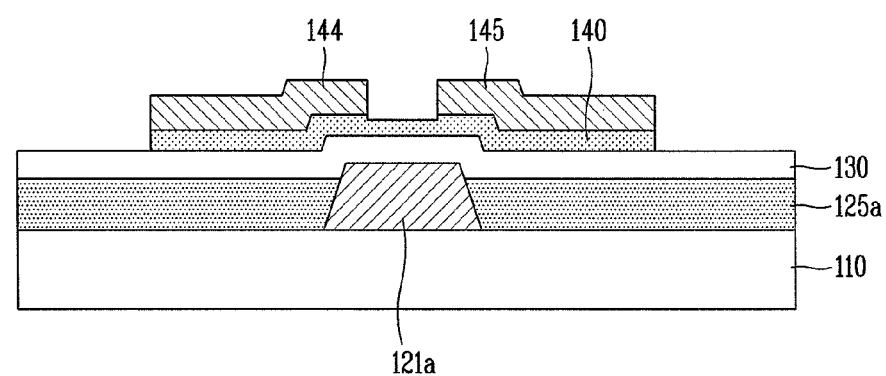

Next, as illustrated in FIG. 5K, the second metal material layer 142 is selectively etched using the remaining second photosensitive layer 143a as an etching mask to form the source electrode 144 and drain electrode 145 separated from each other based on the channel region, thereby completing the process of fabricating a thin-film transistor according to the present invention.

On the other hand, a liquid crystal display having a thin-film transistor fabricated through the fabrication processes according to the present invention will be described below with reference to FIGS. 6 through 8.

Figure 6:
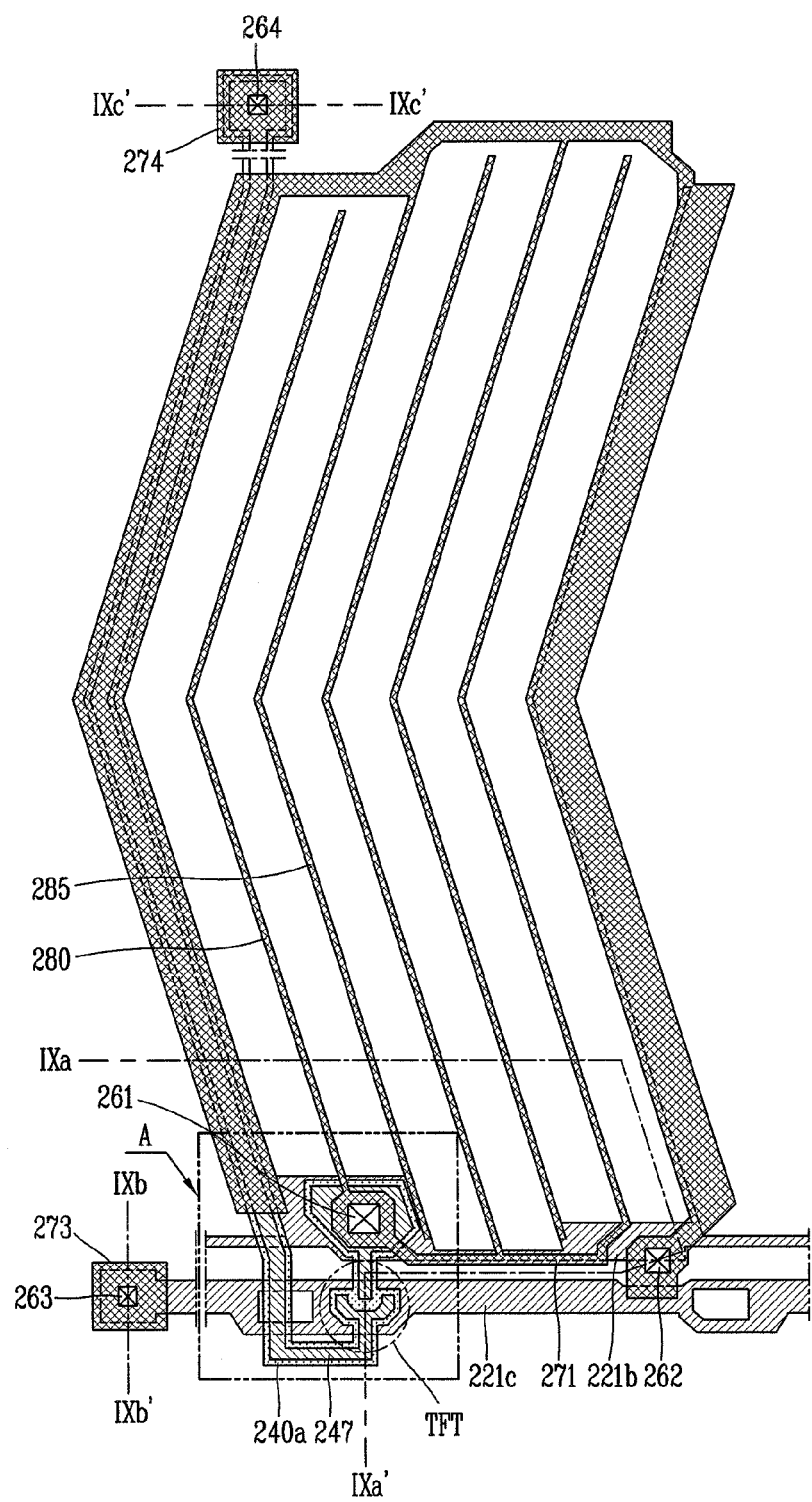
FIG. 6 is a plan view schematically illustrating a liquid crystal display having a thin-film transistor according to the present invention.

FIG. 6 is a plan view schematically illustrating a liquid crystal display having a thin-film transistor according to the present invention.

Figure 7:
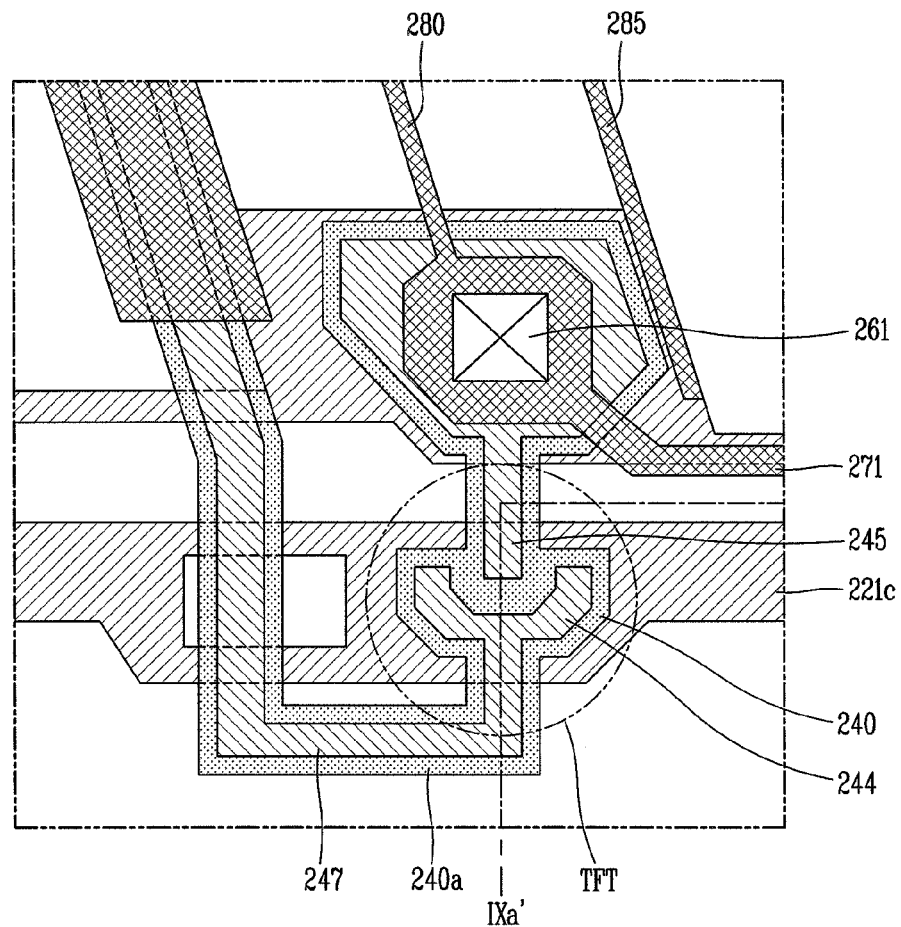
FIG. 7 is an enlarged plan view of a portion "B" of FIG. 6, illustrating a thin-film transistor portion of the liquid crystal display.

FIG. 7 is an enlarged plan view of a portion "B" of FIG. 6, illustrating a thin-film transistor portion of the liquid crystal display.

Figure 8:
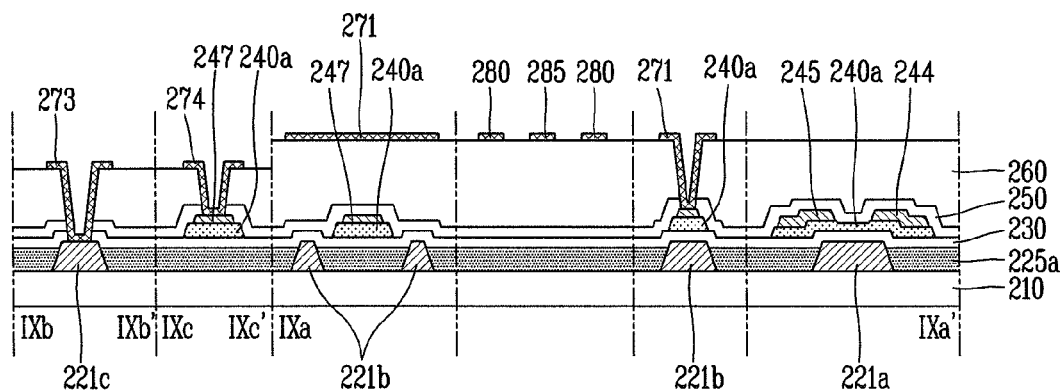
FIG. 8 is a cross-sectional view schematically illustrating a liquid crystal display having a thin-film transistor according to the present invention.

FIG. 8 is a cross-sectional view schematically illustrating a liquid crystal display having a thin-film transistor according to the present invention.

A liquid crystal display having a thin-film transistor according to the present invention, as illustrated in FIGS. 6 through 8, may include, among other elements, a gate line 221c, a data line 247 and a partial common voltage line 221b formed to intersect with each other vertically and horizontally on a substrate 210 to define a plurality of pixels; a planarized insulating layer 225a formed at a portion of the substrate at which the gate line 221c and data line 247 intersect each other, and formed on the substrate containing a gate electrode 221a extended from the gate line 221c, and the substrate excluding an upper portion of the gate electrode 221a; a thin-film transistor (T) made of a gate insulating layer 230 formed on the planarized insulating layer 225a containing an upper portion of the gate electrode 221a, an active layer 240 formed on the gate insulating layer 230 at an upper portion of the gate electrode 221a, and a source electrode 244 and a drain electrode 245 formed on the active layer 240 and separated from each other based on a channel region; a passivation layer 250 and an insulating layer 260 formed over an entire surface of the substrate containing the source electrode 244 and drain electrode 245 to expose the drain electrode 245; and a pixel electrode 280 electrically connected to the drain electrode 245 and a common electrode 285 electrically connected to the partial common voltage line 221b, which are formed to be separated from each other on the insulating layer 260.

The thickness of the gate electrode 221a constituting the thin-film transistor (T) is equal to or greater than 8000 Å and less than 9000 Å, but not limited to the above thickness, and can be also adjusted to a suitable thickness as required.

Furthermore, the gate line 221c and gate electrode 221a may be formed using a non-transparent low resistance conductive material, such as aluminium (Al), aluminium alloy (Al-alloy), tungsten (W), copper (Cu), chromium (Cr), molybdenum (Mo), molybdenum alloy (Mo-alloy), and the like. Alternatively, the gate line 221c and gate electrode 221a may be formed with a multi-layer structure in which two or more low resistance conductive materials are laminated.

Furthermore, the planarized insulating layer 225a is made of any one of an organic material, inorganic material, an organic-inorganic compound, and an organic-inorganic mixture, and has high-temperature and high-planarization characteristics.

The high-planarization characteristic refers to a characteristic in which the planarized insulating layer 225a has a fluid characteristic and thus a layer having the same thickness is not formed at an upper surface of the substrate 210 and gate electrode 221a contrary to what is formed by a CVD process, but the planarized insulating layer 225a having the same thickness is deposited over an entire surface of the substrate 210 based on a surface of the substrate 210 regardless of the existence of the gate electrode 221a and thus the surface of the planarized insulating layer 225a is in a flat state with a small curvature.

However, a protrusion portion having a predetermined thickness may be formed on a surface of the planarized insulating layer 225a due to an effect of the thickness of the gate electrode 221a, but the thickness of the protrusion portion is less than that of the gate electrode 221a, and does not have a large step height from a surface of the planarized insulating layer 225a and thus the surface of the planarized insulating layer 225a has a shape with little curvature as a whole.

Furthermore, the planarized insulating layer 225a has a high-temperature characteristic. That is, the planarized insulating layer 225a is not affected by the CVD process used to form other elements subsequent to the formation of the planarized insulating layer. In other words, the planarized insulating layer 225a is not dissolved or the property thereof is unchanged by the CVD process.

The temperature of the planarized insulating layer 225a having a high-temperature characteristic may be within a range of 200 to 500° C.

Furthermore, the planarized insulating layer 225a may have a characteristic of positive or negative photoresist. The planarized insulating layer 225a may be exposed through a mask when performing an exposure process on the planarized insulating layer when the planarized insulating layer 225a has a positive characteristic, and a back exposure may be carried out with no mask at a rear surface of the substrate 210 when the planarized insulating layer 225a has a negative characteristic. In other words, a non-transparent gate electrode 221a performs the role of a mask during the back exposure process.

Furthermore, the planarized insulating layer 225a exposes an upper surface of the gate electrode 221a not to have an effect on the operation of other elements in a thin-film transistor.

Accordingly, a voltage applied to the gate electrode 221a performs the role of having a constant effect on a channel formed on the active layer 240 at an upper portion thereof through the gate insulating layer 230.

However, the planarized insulating layer 225a does not cover an upper surface of the gate electrode 221a, and therefore, does not have an influence on the operation of elements in the related art.

On the other hand, the gate insulating layer 230 may be formed of a silicon oxide ($SiO_2$) layer or silicon nitride ($SiN_x$) layer. The upper surface of the gate electrode 221a is covered by the gate insulating layer 230.

Furthermore, the active layer 240 may be formed by using amorphous silicon, but it will not be limited to this, and polycrystalline silicon or oxide semiconductor may be also used.

In addition, the source electrode 244 and drain electrode 245 may be formed using the same material as a material forming the gate electrode 221a, for example, a non-transparent low resistance conductive material, such as aluminium (Al), aluminium alloy (Al-alloy), tungsten (W), copper (Cu), chromium (Cr), molybdenum (Mo), molybdenum alloy (Mo-alloy), and the like, or may be formed with a multi-layer structure in which two or more low resistance conductive materials are laminated.

The active layer 240 is patterned through a mask process together with the source and drain electrodes 244, 245 during the process of fabricating a liquid crystal display.

Accordingly, the active layer is formed in a lower region of the data line 247 formed of the same material as that of the source electrode 244 and drain electrode 245 on the same layer, containing a lower region of the source electrode 244 and drain electrode 245.

Hereinafter, a region that is not overlapped with the source electrode 244 and drain electrode 245 on the active layer may be referred to as a dummy active layer 242.

Furthermore, the pixel electrode 280 is substantially parallel to the data line 247 at each pixel on the substrate 210, and branched into a plural number to be connected to the drain electrode 245 of the thin-film transistor. Here, the plurality of branched pixel electrodes 280 are connected to one another through a pixel electrode connecting portion 271 separated from the gate line 221c by a predetermined distance. The pixel electrode connecting portion 271 is connected to the drain electrode 245 of the thin-film transistor through the first contact hole 261.

A plurality of branched common electrodes 285 are formed in parallel with the pixel electrodes 280 in an alternating manner, on each pixel of the substrate. The common electrodes 285 together with the pixel electrodes 280 form a horizontal electric field to drive a liquid crystal layer (not shown).

The partial common voltage line 221b is formed at an edge of the each pixel, and the partial common voltage line 221b is connected to the common electrodes 285 through a second contact hole 262.

Furthermore, the partial common voltage line 221b forms a storage capacitor by interposing a region overlapped with the pixel electrode connecting portion 271 and the gate insulating layer 230 and dummy active layer 242.

A gate pad 273 connected to a gate driving portion (not shown) is formed at the end portion of the gate line 221c on the substrate, and a data pad 274 connected to a data driving portion (not shown) is formed at an end portion of the data line 247.

The gate pad 273 is connected to the gate line 221c through a third contact hole 263 formed on the gate insulating layer, passivation layer and insulating layer, and the data pad 274 is connected to data line 247 through a fourth contact hole 264 formed on the passivation layer 250 and insulating layer 260.

On the other hand, though not shown in the drawing, black matrices are formed on a color filter substrate bonded to the substrate 210 by a predetermined gap to prevent light from passing through a region excluding the pixel area, and a red (R), green (G) and blue (B) color filter layer is formed on the color filter substrate corresponding to a pixel area between the black matrices.

Furthermore, a liquid crystal layer (not shown) is interposed between the substrate 210 and the color filter substrate (not shown).

On the other hand, a method of fabricating a liquid crystal display having the configuration will be described below with reference to FIGS. 9A through 9J.

FIGS. 9A through 9J are process cross-sectional views illustrating a method of fabricating a liquid crystal display having a thin-film transistor according to the present invention. FIGS. 9A through 9J are views schematically illustrating fabrication cross-sectional views in which the liquid crystal display is cut at portions IXa-IXa', IXb-IXb' and IXc-IXc'. In particular, the portion IXa-IXa' illustrates a thin-film transistor, a storage capacitor and a pixel area, and the portion IXb-IXb' illustrates a gate pad, and the portion IXc-IXc' illustrates a data pad.

First, a first metal material layer (not shown) having a predetermined thickness is formed on the substrate 210 using a sputtering process. The thickness of first metal material layer may be equal to or greater than 8000 Å and less than 9000 Å. However, the thickness of the first metal material layer is not limited to the above thickness, and can be also adjusted to a suitable thickness as required.

The first metal material layer may be formed using a non-transparent low resistance conductive material, such as aluminium (Al), aluminium alloy (Al-alloy), tungsten (W), copper (Cu), chromium (Cr), molybdenum (Mo), molybdenum alloy (Mo-alloy), and the like, or may be formed with a multi-layer structure in which two or more low resistance conductive materials are laminated.

Figure 9A:
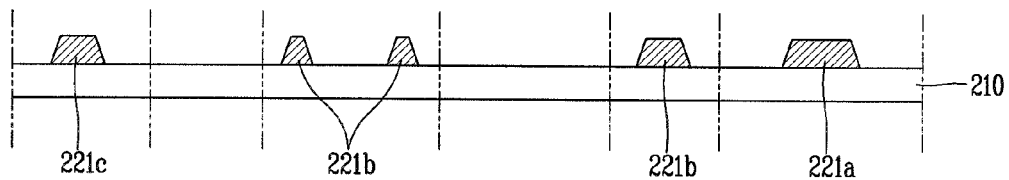
FIGS. 9A through 9J are cross-sectional views illustrating a method of fabricating a liquid crystal display having a thin-film transistor according to the present invention.

Next, as illustrated in FIG. 9A, the first metal material layer is selectively patterned through a first mask process using a photolithography process technology to form the gate electrode 221a, partial common voltage line 221b and gate line 221c having a predetermined thickness.

Here, a region formed with the thin-film transistor denotes the gate electrode 221a, and a region formed with the storage capacitor and a region formed with the data line denotes the partial common voltage line 221b, and a region formed with the gate pad denotes the gate line 221c.

Furthermore, the first metal material layer is patterned at the same time by one mask process, and though not shown in the drawing, may be further formed with a common line (not shown), a connecting line (not shown), and the like.

The common line (not shown) is formed in a substantially horizontal direction with respect to the gate line 221c, and the connecting line (not shown) may be formed in a bending structure same as the common electrode and pixel electrode to be formed in the subsequent processes.

Figure 9B:
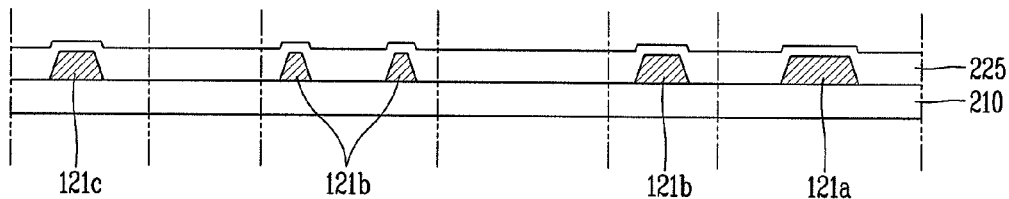

Subsequently, as illustrated in FIG. 9B, a planarized insulating layer 225 is coated on an entire surface of the substrate. The planarized insulating layer 225 is made of any one of an organic material, inorganic material, an organic-inorganic compound, and an organic-inorganic mixture, and has high-temperature and high-planarization characteristics.

The high-planarization characteristic refers to a characteristic in which the planarized insulating layer 225 has a fluid characteristic and thus a layer having the same thickness is not formed at an upper surface of the substrate 210, the gate line 221c, gate electrode 221a and partial common voltage line 221b contrary to what is formed by a CVD process, but the planarized insulating layer 225 having the same thickness is deposited over an entire surface of the substrate 210 based on a surface of the substrate 210 regardless of the existence of the gate electrode 221a and thus the surface of the planarized insulating layer 225 is in a flat state with little curvature. The gate line 221c, gate electrode 221a and partial common voltage line 221b will be described later around the gate electrode 221a.

However, a protrusion portion having a predetermined thickness may be formed on a surface of the common electrode 225 due to an effect of the thickness of the gate electrode 221a, but the thickness of the protrusion portion is less than that of the gate electrode 221a, and does not have a large step height from a surface of the planarized insulating layer 225 and thus the surface of the planarized insulating layer 225 has a shape with little curvature as a whole.

Furthermore, the planarized insulating layer 225 has a high-temperature characteristic. It means that the planarized insulating layer 225 is not affected by the CVD process used to form other elements subsequent to the formation of the planarized insulating layer. In other words, the planarized insulating layer 225 is not dissolved or the property thereof is unchanged by the CVD process.

The temperature of the planarized insulating layer 225 having a high-temperature characteristic may be within a range of 200 to 500° C.

Furthermore, the planarized insulating layer 225 may have a characteristic of positive or negative photoresist. The planarized insulating layer 225 may be exposed through a mask when performing an exposure process on the planarized insulating layer when the planarized insulating layer 225 has a positive characteristic, and a back exposure may be carried out with no mask at a rear surface of the substrate 210 when the planarized insulating layer 225 has a negative characteristic. In other words, a non-transparent gate electrode 221a performs the role of a mask during the back exposure process.

In particular, according to the present invention, a case where a negative photoresist is applied to the planarized insulating layer 225 is taken as an example.

Furthermore, the planarized insulating layer 225 exposes an upper surface of the gate electrode 221a not to have an effect on the operation of other elements in a thin-film transistor.

Accordingly, a voltage applied to the gate electrode 221a performs the role of having a constant effect on a channel formed on the active layer 240 at an upper portion thereof through the gate insulating layer 230 in the subsequent process.

However, the planarized insulating layer 225 does not cover an upper surface of the gate electrode 221a, and therefore, does not have an influence on the operation of elements in the related art.

Figure 9C:
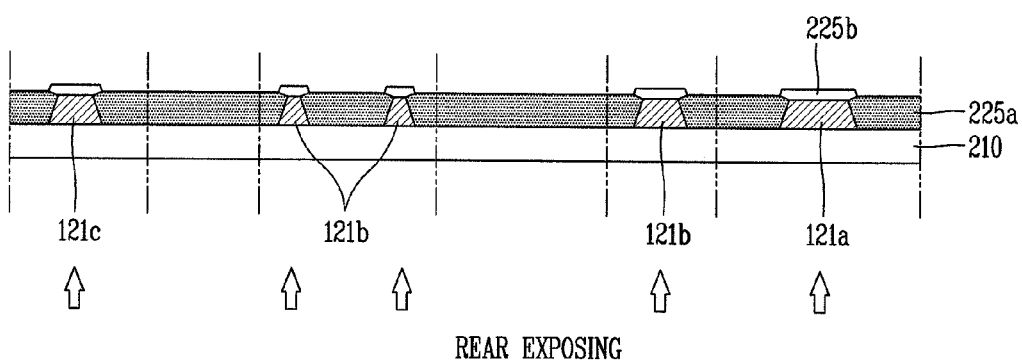

Subsequently, as illustrated in FIG. 9C, a back exposure on the planarized insulating layer 225 is carried out for exposure. The gate electrode 221a has a non-transparent characteristic, and thus performs the role of a photoresist mask. Furthermore, the back exposure irradiates light from the rear surface without using a mask, thereby having an advantage in the aspect of reducing the process cost.

Accordingly, a portion of the planarized insulating layer 225 formed at the remaining portion excluding an upper portion of the gate electrode 221a is exposed.

Figure 9D:
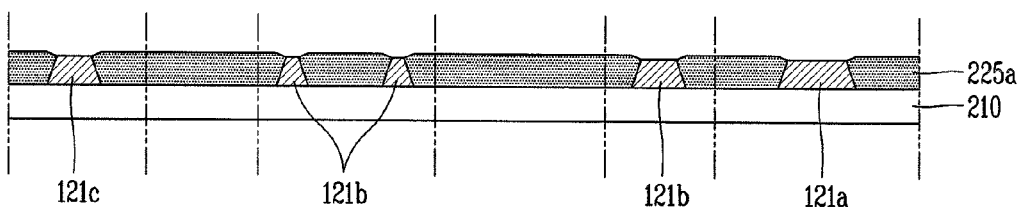

Next, as illustrated in FIG. 9D, the planarized insulating layer 225 is patterned through the developing process subsequent to the exposure process to form the planarized insulating layer pattern 225a. The planarized insulating layer 225 has a negative characteristic, and therefore, an exposed portion thereof is remained, and an unexposed portion thereof, namely, a portion of the planarized insulating layer at an upper portion of the gate electrode 221a is cured and removed during the developing process.

Accordingly, the planarized insulating layer pattern 225a is remained only on the substrate 210 excluding the gate electrode 221a.

Hereinafter, the process of developing the planarized insulating layer 225 will be described below in brief. During the developing process, a portion that has been cured on the planarized insulating layer 225 is not dissolved by developing solution. The developing solution used for the developing process is a typical organic solvent such as xylene.

Accordingly, the planarized insulating layer 225 at an upper surface area of the gate electrode 221a is dissolved and removed in the developing solution during the developing process, and the upper surface of the gate electrode 221a may be exposed.

Next, a curing process may be carried out. The curing process refers to a process of moving the substrate 210 to a chamber of the heating device (not shown) such as a furnace, an oven, or the like, and then removing a solvent or the like to cure the planarized insulating layer 225.

An electric or magnetic field application device (not shown) may be provided in the heating device to apply an electric or magnetic field to the substrate 210.

Subsequent to the curing process, a volume of the planarized insulating layer pattern 225a may be reduced within a predetermined range.

Figure 9E:
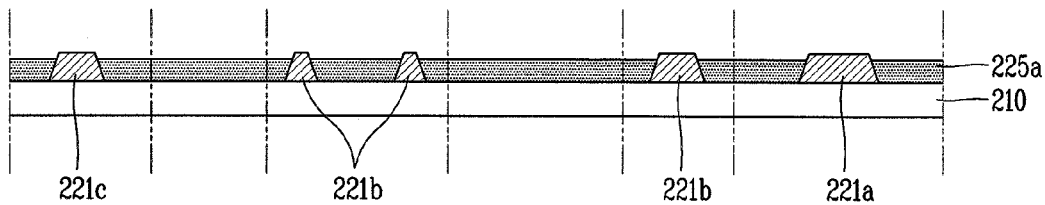

Subsequently, as illustrated in FIG. 9E, the ashing process is carried out to strip and adjust the planarized insulating layer pattern 225a. During the ashing process, part of a surface of the planarized insulating layer pattern 125a is removed using a gas, for example, oxygen (O2) to reduce a thickness of the planarized insulating layer pattern 225a in a state that an upper surface of the gate electrode 221a is exposed.

Furthermore, the thickness of the planarized insulating layer pattern 225a may be formed equal to or less than that of the gate electrode 221a.

Then, when a thickness of the planarized insulating layer pattern 225a is less than that of the gate electrode 221a, a predetermined step height may be formed between the planarized insulating layer 225 and the gate electrode 221a. The thickness of the step height formed between the planarized insulating layer 225 and the gate electrode 221a may be 1-15% of the thickness of the gate electrode 221a. Accordingly, a partial region at both lateral surfaces of the gate electrode 221a is exposed together with an upper surface of the gate electrode 221a by forming the step height.

Here, the thickness of the planarized insulating layer 225a is formed higher than that of the gate electrode 221a, and when an upper surface of the gate electrode 221a is exposed, it may occur a phenomenon that the planarized insulating layer pattern 225a is loose by as much as a predetermined distance at a boundary between the gate electrode 221a and the planarized insulating layer pattern 225a. It is a portion causing a crack on the element.

On the other hand, according to another embodiment, the exposure process, developing process, and curing process may be omitted from the aforementioned processes to immediately perform the ashing process.

The ashing process is a process of removing the planarized insulating layer pattern 225a by as much as a predetermined distance, and the planarized insulating layer pattern 225a exposes an upper portion of the gate electrode 221a not to form a step height of patterning in a large scale, and therefore, the exposure process, developing process and curing process may be omitted.

Furthermore, according to still another embodiment, a method of dry or wet etching may be used instead of the ashing process.

Figure 9F:
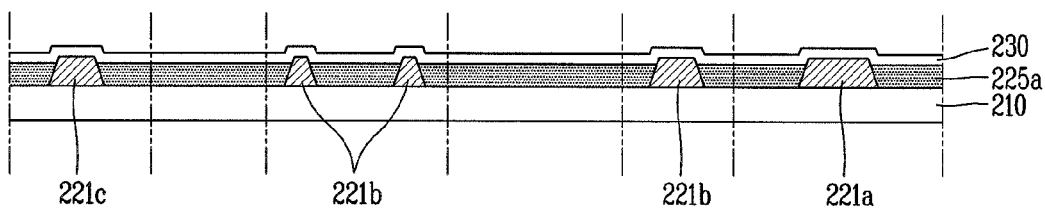

Next, as illustrated in FIG. 9F, the gate insulating layer 230 is formed over an entire surface of the gate electrode 221a and planarized insulating layer pattern 225a. The gate insulating layer 230 may be formed of a silicon oxide layer (SiO2) or silicon nitride layer (SiNx). The upper surface of the gate electrode 221a is covered by the gate insulating layer 230.

Here, the planarized insulating layer pattern 225a exposes an upper surface of the gate electrode 221a not to have an effect on the operation of other elements in a thin-film transistor.

Furthermore, a voltage applied to the gate electrode 221a performs the role of having a constant effect on a channel formed on the active layer 240 at an upper portion thereof through the gate insulating layer 230. However, the planarized insulating layer pattern 225a does not cover an upper surface of the gate electrode 221a, and therefore, does not have an influence on the operation of elements in the related art.

Subsequently, though not shown in the drawing, a semiconductor layer, an Ohmic contact layer, and a second metal material layer made of amorphous silicon are sequentially formed at an upper portion of the gate insulating layer 230. The ohmic contact layer (not shown) formed at an upper portion of the semiconductor layer is made of n+ amorphous silicon layer, and patterned in the same form as a source electrode and a drain electrode formed in the subsequent process. The ohmic contact layer performs the role of establishing electrical contact between the source electrode, drain electrode and the active layer.

Furthermore, similar to the first metal material layer, the second metal material layer (not shown) may be formed of a non-transparent low resistance conductive material, such as aluminium, aluminium alloy, tungsten, copper, chromium, molybdenum, molybdenum alloy, and the like, or with a multi-layer structure in which two or more low resistance conductive materials are laminated.

Figure 9G:
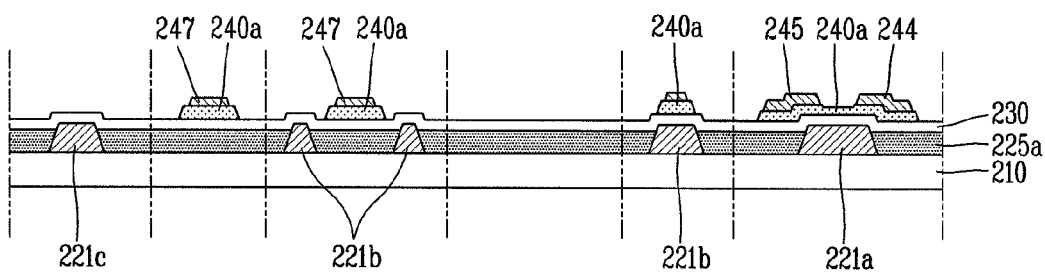

Next, as illustrated in FIG. 9G, an exposure process, a developing process, and a patterning process are carried out through a mask process with a photolithography technology using an exposure mask (not shown) which is a diffraction mask to expose the source electrode 244 and drain electrode 245 separated from each other based on a channel region.

The active layer 240 is patterned through one mask process, and therefore, formed in both the data line 247 formation region and data pad formation region. Accordingly, a portion other than the active layer 240 at an upper portion of the gate electrode 221a becomes a dummy active layer 242.

Furthermore, the data line 247 is formed at the same time during the formation of the source electrode 244 and drain electrode 245 when patterning the second metal material layer.

Figure 9H:
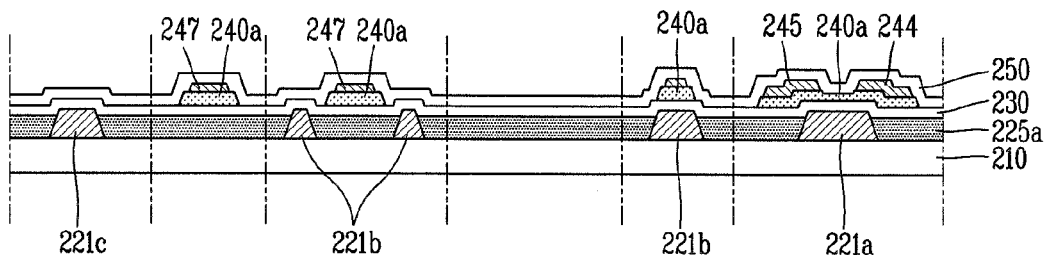

Subsequently, as illustrated in FIG. 9H, the passivation layer 250 is formed over an entire surface of the substrate 210. The passivation layer 250 is formed of a silicon oxide layer (SiO2) or silicon nitride layer (SiNx).

The passivation layer 250 performs the role of protecting elements such as the source electrode 244, the drain electrode 245, the data line 247, and the like.

Next, as illustrated in FIG. 9H, the insulating layer 260 is formed at an upper surface of the passivation layer 250. The insulating layer 260 is formed by using a silicon oxide layer (SiO2) or silicon nitride layer (SiNx).

Subsequently, a photosensitive layer (not shown) is coated on the insulating layer 260, and then a photolithography process using a third mask (not shown) is carried out to pattern the photosensitive layer (not shown), thereby forming a third photosensitive layer pattern (not shown) corresponding to the first through the fourth contact hole.

Figure 9I:
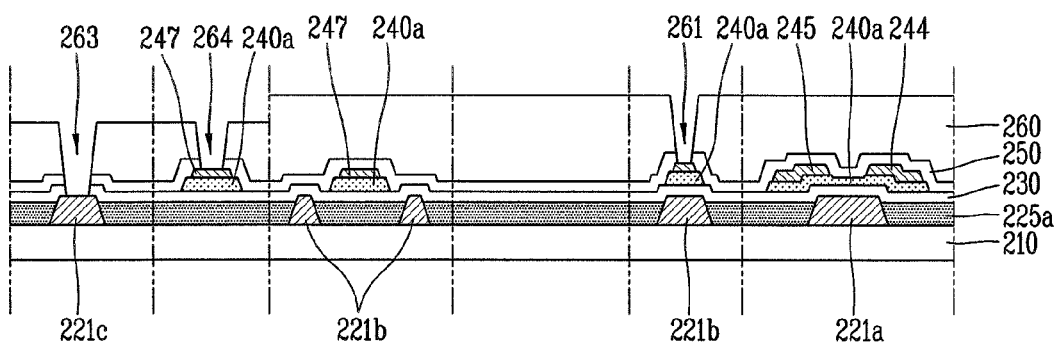
Figure 9J:
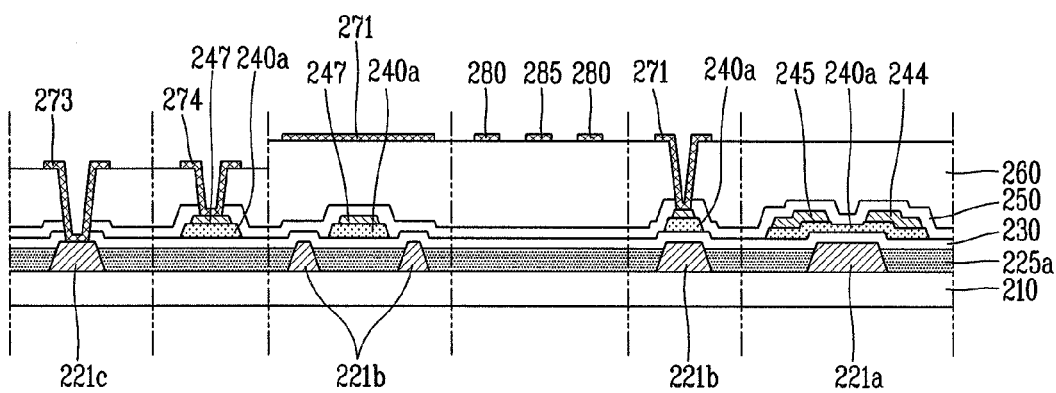

Next, as illustrated in FIG. 9I, the insulating layer 260 and passivation layer 250 are selectively removed using the third photosensitive layer pattern as an etching mask to form the first through the fourth contact hole 261, 262, 263, 264 (the second contact hole is not shown).

The first contact hole 261 exposes part of the drain electrode 245, and the second contact hole (not shown) exposes a region that is overlapped with part of the partial common voltage line 221b on the gate insulating layer 230, and the third contact hole 263 exposes a region that is overlapped with an end portion of the gate line 221c at the gate pad. Furthermore, the fourth contact hole 264 exposes an end portion of the data line 247 at the data pad.

Next, the remaining third photosensitive layer pattern (not shown) is removed.

Subsequently, though not shown in the drawing, a third metal layer (not shown) and a fourth photosensitive layer (not shown) are formed on the substrate 210 formed with the first through the fourth contact hole 261, 262, 263, 264 (the second contact hole is not shown), and then a fourth photolithography process using a fourth mask (not shown) is carried out to pattern the fourth photosensitive layer, thereby forming a fourth photosensitive layer pattern (not shown). The fourth photosensitive layer pattern (not shown) is located at a region corresponding to the pixel electrode 280, common electrode 285, pixel electrode connecting portion 271, gate pad 273, and data pad 274, which will be formed later.

Next, as illustrated in FIG. 9I, the third metal layer is selectively removed using the fourth photosensitive layer pattern as an etching mask to form the pixel electrode 280, common electrode 285, pixel electrode connecting portion 271, gate pad 273, and data pad 274.

The pixel electrode connecting portion 271 is connected to the end portions of the plurality of branched pixel electrodes 280 and connected to the drain electrode 245 through the first contact hole 261. Furthermore, the common electrode 285 is connected to the partial common voltage line 221b through the second contact hole. Then, the gate pad 273 is connected to an end portion of the gate line 221c through the third contact hole 263. The data pad 274 is connected to an end portion of the data line 247 through the fourth contact hole 264.

The partial common voltage line 221b forms a storage capacitor by interposing a region overlapped with the pixel electrode connecting portion 271 and the gate insulating layer 230 and dummy active layer 242.

Meanwhile, according to an embodiment of the present invention, the method of fabricating a thin-film transistor array substrate in an in-plane switching mode liquid crystal panel has been described, but the present invention is not limited to this, and also applicable to all type of thin-film transistors as well as all types of array substrates having a thin-film transistor in a liquid crystal display.

As described above, a thin-film transistor, a fabrication method thereof, a liquid crystal display device using the same, and a fabrication method thereof according to the present invention may have the following effects.

According to a thin-film transistor, a fabrication method thereof, a liquid crystal display device using the same, and a fabrication method thereof in accordance with the present invention, it may be possible to reduce failures occurred during the formation of a gate insulating layer that has been a problem in the related art. In particular, in the related art, a gate electrode is formed in a thick manner, thus causing a phenomenon that a lateral surface of the gate electrode is exposed during the etching process or data is open, but according to the present invention, a lateral surface of the gate electrode is covered in a thick manner and a step height due to a thickness of the gate electrode can be reduced by the formation of a planarized insulating layer, thus preventing a phenomenon that a lateral surface of the gate electrode is exposed during the etching process or data is open in the related art.

Furthermore, according to a thin-film transistor, a fabrication method thereof, a liquid crystal display device using the same, and a fabrication method thereof in accordance with the present invention, processes formed with a thick layer can be easily carried out due to the formation of an interlayer insulating layer. In other words, a gate insulating layer formed subsequent to the interlayer insulating layer may be formed with no large curvature, thereby facilitating the deposition of other subsequently formed elements. It has an effect of reducing product cost consumed during the implementation of an ultra dimension (UD) product.

In addition, according to a thin-film transistor, a fabrication method thereof, a liquid crystal display device using the same, and a fabrication method thereof in accordance with the present invention, metal patterns including a gate electrode can be implemented in the form of a narrow and thick shape rather than in the form of a thin and wide area to increase the transmittance in case of a liquid crystal display, thereby reducing the cost incurred during the fabrication of a backlight unit.

Although the preferred embodiments of the present invention have been described in detail, it should be understood by those skilled in the art that various modifications and other equivalent embodiments thereof can be made.

Consequently, the rights scope of the present invention is not limited to the embodiments and various modifications and improvements thereto made by those skilled in the art using the basic concept of the present invention as defined in the accompanying claims will fall in the rights scope of the invention.

What is claimed is:

1. A thin-film transistor, comprising:
   a gate electrode formed on a substrate;
   a planarized insulating layer formed on a lateral surface portion of the gate electrode and an upper portion of the substrate, the planarized insulating layer having a thickness less than that of the gate electrode and exposing an upper surface portion of the gate electrode;
   a gate insulating layer formed on the planarized insulating layer containing an upper portion of the gate electrode;
   an active layer formed at an upper portion of the planarized insulating layer located at an upper side of the gate electrode; and
   a source electrode and a drain electrode formed on the active layer and separated from each other based on a channel region.

2. The thin-film transistor of claim 1, wherein a step height between the planarized insulating layer and the gate electrode has a thickness of 1-15% of the thickness of the gate electrode, and the planarized insulating layer forms a height lower than the gate electrode.

3. The thin-film transistor of claim 1, wherein the planarized insulating layer has a high-temperature characteristic in which the property and state is unchanged at temperatures of 200-500° C., and is formed of any one of an organic material, inorganic material, an organic-inorganic compound, and an organic-inorganic mixture.

4. The thin-film transistor of claim 1, wherein the planarized insulating layer has a characteristic of negative photoresist.

5. A method of fabricating a thin-film transistor, the method comprising:
   forming a gate electrode on a substrate;
   forming a planarized insulating layer at a lateral surface portion of the gate electrode and an upper portion of the substrate;
   forming a gate insulating layer on the planarized insulating layer containing an upper portion of the gate electrode;
   forming an active layer at an upper portion of the planarized insulating layer located at an upper side of the gate electrode; and
   forming a source electrode and a drain electrode separated from each other based on a channel region on the active layer,
   wherein the planarized insulating layer has a thickness less than that of the gate electrode, and exposes an upper surface portion of the gate electrode.

6. The method of claim 5, wherein said forming a planarized insulating layer at a lateral surface portion of the gate electrode and an upper portion of the substrate further comprises:
   performing a back exposure of the planarized insulating layer using the gate electrode as a mask at a rear surface of the substrate; and
   developing and curing the planarized insulating layer to remove a portion of the planarized insulating layer formed at an upper surface of the unexposed gate electrode.

7. The method of claim 6, wherein the planarized insulating layer has a characteristic of negative photoresist.

8. The method of claim 5, wherein the planarized insulating layer has a high-temperature characteristic in which the property and state is unchanged at temperatures of 200-500° C., and is formed of any one of an organic material, inorganic material, an organic-inorganic compound, and an organic-inorganic mixture.

9. The method of claim 6, wherein an ashing step is further added subsequent to said removing a portion of the planarized insulating layer such that a step height between the planarized insulating layer and the gate electrode has a thickness of 1-15% of the thickness of the gate electrode.

10. A liquid crystal display having a thin-film transistor, comprising:
   a gate line, a data line and a partial common voltage line formed to intersect with each other vertically and horizontally on a substrate to define a plurality of pixels;
   a planarized insulating layer formed at a portion of the substrate at which the gate line and data line intersect each other, and formed on the substrate containing a gate electrode extended from the gate line, and a lateral surface of the gate line, gate electrode and partial common voltage line;
   a thin-film transistor made of a gate insulating layer formed on the planarized insulating layer containing an upper portion of the gate electrode, an active layer formed on the gate insulating layer at an upper portion of the gate electrode and partial common voltage line, and a source electrode and a drain electrode formed on the active layer and separated from each other based on a channel region;

a passivation layer and an insulating layer formed over an entire surface of the substrate containing the source electrode and drain electrode to expose the drain electrode; and a pixel electrode electrically connected to the drain electrode and a common electrode electrically connected to the partial common voltage line, which are formed to be separated from each other and branched into a plural number on the insulating layer.

11. The liquid crystal display having a thin-film transistor of claim 10, wherein the step height has a thickness of 1-15% of the thickness of the gate electrode, and the planarized insulating layer forms a height lower than the gate electrode.

12. The liquid crystal display having a thin-film transistor of claim 10, wherein the planarized insulating layer has a high-temperature characteristic in which the property and state is unchanged at temperatures of 200-500° C., and is formed of any one of an organic material, inorganic material, an organic-inorganic compound, and an organic-inorganic mixture.

13. The liquid crystal display having a thin-film transistor of claim 10, wherein the planarized insulating layer has a characteristic of negative photoresist.

14. A method of fabricating a liquid crystal display having a thin-film transistor, the method comprising:

forming a gate line, a gate electrode and a partial common voltage line on a substrate;

forming a planarized insulating layer at an upper portion of the substrate containing a lateral surface of the gate line, gate electrode and partial common voltage line;

forming a gate insulating layer on the planarized insulating layer containing an upper portion of the gate line, gate electrode and partial common voltage line;

forming an active layer on the gate insulating layer at an upper side of the gate electrode;

forming a source electrode and a drain electrode separated from each other based on a channel region on the active layer;

forming a passivation layer and an insulating layer over an entire surface of the substrate containing the source electrode and drain electrode to expose the drain electrode; and forming a pixel electrode electrically connected to the drain electrode and a common electrode electrically connected to the partial common voltage line, which are formed to be separated from each other and branched into a plural number on the insulating layer.

15. The method of claim 14, wherein said forming a planarized insulating layer at a lateral surface portion of the gate line, gate electrode and partial common voltage line and at an upper portion of the substrate further comprises:

performing a back exposure of the planarized insulating layer using the gate electrode as a mask at a rear surface of the substrate; and developing and curing the planarized insulating layer to remove a portion of the planarized insulating layer formed at an upper surface of the unexposed gate electrode.

16. The method of claim 15, wherein the planarized insulating layer has a characteristic of negative photoresist.

17. The method of claim 14, wherein the planarized insulating layer has a high-temperature characteristic in which the property and state is unchanged at temperatures of 200-500° C., and is formed of any one of an organic material, inorganic material, an organic-inorganic compound, and an organic-inorganic mixture.

18. The method of claim 15, wherein an ashing step is further added subsequent to said removing a portion of the planarized insulating layer such that the a step height between the planarized insulating layer and the gate electrode has a thickness of 1-15% of the thickness of the gate electrode.

* * * * *